(12) United States Patent
Hasegawa

(10) Patent No.: US 8,049,316 B2
(45) Date of Patent: Nov. 1, 2011

(54) SEMICONDUCTOR PACKAGE

(75) Inventor: Tsuyoshi Hasegawa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 388 days.

(21) Appl. No.: 12/393,680

(22) Filed: Feb. 26, 2009

(65) Prior Publication Data
US 2009/0205806 A1    Aug. 20, 2009

Related U.S. Application Data

(63) Continuation of application No. PCT/JP2008/052572, filed on Feb. 15, 2008.

(30) Foreign Application Priority Data

Feb. 15, 2007 (JP) ................... 2007-035356
Feb. 8, 2008 (JP) ................... 2008-029614

(51) Int. Cl.
*H01L 23/34* (2006.01)

(52) U.S. Cl. ............... 257/678; 257/712; 257/E23.113; 165/80.2

(58) Field of Classification Search ............ 257/678, 257/703, 706, 712, 713, 720, E23.113; 165/80.2
See application file for complete search history.

(56) References Cited

U.S. PATENT DOCUMENTS

| | | | |
|---|---|---|---|
| 5,998,240 A | 12/1999 | Hamilton et al. | |
| 6,205,022 B1 | 3/2001 | Bhatia et al. | |
| 6,660,566 B2 * | 12/2003 | Masayuki | 438/124 |
| 6,847,112 B2 | 1/2005 | Ito | |
| 7,081,670 B2 | 7/2006 | Shibuya et al. | |
| 7,154,753 B2 | 12/2006 | Kobayashi | |
| 7,168,152 B1 | 1/2007 | Ehret et al. | |
| 7,190,054 B2 | 3/2007 | Ishiyama | |
| 7,213,338 B2 | 5/2007 | Tonosaki et al. | |
| 7,256,492 B2 | 8/2007 | Kim | |
| 7,352,581 B2 | 4/2008 | Tomioka | |
| 7,401,340 B2 * | 7/2008 | Leigh | 719/332 |
| 7,449,726 B2 | 11/2008 | Nakanishi et al. | |

(Continued)

FOREIGN PATENT DOCUMENTS

| | | |
|---|---|---|
| JP | 2001-144237 | 5/2001 |
| JP | 2003-37196 | 2/2003 |

(Continued)

OTHER PUBLICATIONS

U.S. Appl. No. 12/978,813, filed Dec. 27, 2010, Hasegawa.

(Continued)

*Primary Examiner* — Roy K Potter
(74) *Attorney, Agent, or Firm* — Oblon, Spivak, McClelland, Maier & Neustadt, L.L.P.

(57) ABSTRACT

A semiconductor package is provided with a package body including a base part and a semiconductor device housing part housing a semiconductor device. An electric terminal electrically connected to the device is provided in the housing part and is exposed to an outer surface. A high heat transfer element is arranged from a heat generating part corresponding position corresponding to a heat generating part of the device to a position outside the corresponding position in the base part. The base part is configured by contacting a plurality of thin sheets mutually closely with each other and by bonding integrally with each other. The high heat transfer element includes particles configured by a material having a thermal conductivity higher than that of the base part and dispersed in the base part. The particles are dispersed between two mutually adjacent thin sheets among the thin sheets.

5 Claims, 2 Drawing Sheets

U.S. PATENT DOCUMENTS

| | | |
|---|---|---|
| 7,514,782 B2 * | 4/2009 | Hiramatsu et al. ............ 257/703 |
| 7,515,415 B2 | 4/2009 | Monfarad et al. |
| 7,545,033 B2 | 6/2009 | Grant |
| 2007/0187069 A1 | 8/2007 | Ueno et al. |
| 2008/0197462 A1 | 8/2008 | Hasegawa |
| 2008/0286602 A1 | 11/2008 | Hasegawa |
| 2009/0008770 A1 | 1/2009 | Hasegawa |
| 2009/0039500 A1 | 2/2009 | Ito et al. |
| 2009/0091891 A1 | 4/2009 | Hasegawa |

FOREIGN PATENT DOCUMENTS

| | | |
|---|---|---|
| JP | 2004-28557 | 1/2004 |
| JP | 2004-249589 | 9/2004 |
| JP | 2004-288949 | 10/2004 |
| JP | 2005-175006 | 6/2005 |
| JP | 2005-236276 | 9/2005 |
| JP | 2006-13420 | 1/2006 |
| JP | 2006-32798 | 2/2006 |

OTHER PUBLICATIONS

U.S. Appl. No. 12/579,023, filed Oct. 14, 2009, Takagi, et al.

U.S. Appl. No. 12/533,494, filed Jul. 31, 2009, Hasegawa.

* cited by examiner

SEMICONDUCTOR PACKAGE

CROSS-REFERENCE TO RELATED APPLICATIONS

This is a Continuation Application of PCT Application No. PCT/JP2008/052572, filed Feb. 15, 2008, which was published under PCT Article 21(2) in Japanese.

This application is based upon and claims the benefit of priority from prior Japanese Patent Applications No. 2007-035356, filed Feb. 15, 2007; and No. 2008-029614, filed Feb. 8, 2008, the entire contents of both of which are incorporated herein by reference.

BACKGROUND OF THE INVENTION

1. Field of the Invention

The present invention relates to a semiconductor package housing a semiconductor device.

2. Description of the Related Art

There has been known a semiconductor package which includes: a package body including a base part having a first surface and a second surface in the opposite side of the first surface, and a semiconductor device housing part provided on the first surface and housing a semiconductor device; and an electric terminal provided in the semiconductor device housing part, electrically connected to the semiconductor device housed in the semiconductor device housing part, and exposed on an outer surface of the semiconductor device housing part.

The semiconductor device is formed by implementing a desired circuit pattern on the surface of a substrate formed of a substrate material such as silicon and generates a large amount of heat from the circuit pattern during operation. If the temperature of the circuit pattern exceeds a certain temperature, the circuit pattern cannot exhibit its desired performance.

In such a conventional semiconductor package, at least the base part of the semiconductor package is constructed by a material with high thermal conductivity such as copper, aluminum, copper alloy, or aluminum alloy to dissipate heat generated by the semiconductor device. Heat generated by the semiconductor device housed in the semiconductor device housing part is conducted to the package body, mainly to the base part, and further to objects which are in contact with the package body, mainly the base part, such as a semiconductor package support member on which the base part is placed and by which the base part is supported, air around the package body and others to dissipate heat.

In recent years, with an increasingly higher degree of integration of the circuit pattern implemented on the semiconductor device and an increasing amount of heat generated by the semiconductor device, various structures to improve efficiency of heat conduction of the semiconductor package have been proposed.

Japanese Patent Application KOKAI Publication No. 2005-175006 discloses an example of the above described heat conduction efficiency improving structure. In this heat conduction efficiency improving structure, particles of diamond are dispersed in a base material made of metal and the surface of the base material is coated with a coating layer of the same material as the base material so that the coating layer prevents exposure of diamond particles from the surface of the base material.

With the heat conduction efficiency improving structure described in Japanese Patent Application KOKAI Publication No. 2005-175006, it is not clear how to disperse particles of diamond in a base material made of metal. When particles of diamond are dispersed in a sheet of base material, particles of diamond are normally dispersed while the base material is being melted. However, a method for manufacturing such a heat conduction efficiency improving structure including melting of a base material is complicated and energy efficiency thereof is low. Moreover, the above structure becomes relatively thick.

BRIEF SUMMARY OF THE INVENTION

According to one aspect of the present invention, a semiconductor device comprises: a package body including a base part having a first surface and a second surface on an opposite side of the first surface, and a semiconductor device housing part provided on the first surface and in which a semiconductor device having a heat generating part is housed, the base part further having a heat generating part corresponding position corresponding to the heat generating part of the semiconductor device and a position outside the heat generating part corresponding position; an electric terminal provided in the semiconductor device housing part, electrically connected to the semiconductor device, and exposed to an outer surface of the semiconductor device housing part; and a high heat transfer element having a thermal conductivity higher than that of the base part, arranged from the heat generating part corresponding position to the outside position in the base part, and transferring heat generated by the heat generating part of the semiconductor device from the heat generating part corresponding position to the outside position in the base part. The base part is configured by contacting a plurality of thin sheets mutually closely with each other and by bonding integrally with each other, the high heat transfer element includes particles configured by a material having a thermal conductivity higher than that of the base part, and dispersed in the base part, and the particles of the high heat transfer element are dispersed between two mutually adjacent thin sheets among the plurality of thin sheets of the base part.

With the semiconductor package according to the present invention and configured as described above, heat generated by the heat generating part of the semiconductor device housed in the semiconductor device housing part of the package body is swiftly transferred from the heat generating part corresponding position corresponding to the heat generating part of the semiconductor device to the position outside the heat generating part corresponding position in the base part of the package body by the particles included in the high heat transfer element provided in the base part of the package body, having the thermal conductivity higher than that of the base part, and arranged from the heat generating part corresponding position to the position outside the heat generating part corresponding position in the base part, the particles being dispersed between two mutually adjacent thin sheets among the plurality of thin sheets being mutually in contact with and integrally bonded with each other to configure the base part. As a result, the heat is swiftly diffused from the heat generating part corresponding position to the outside position in the base part and further, swiftly dissipated to objects being in contact with the package body, such as a semiconductor package support member on which the package body is placed and by which the package body is supported, air around the package body, etc. With such a configuration, a sufficient cooling effect can be achieved against an increase in the amount of heat generated by the semiconductor device in recent years.

Moreover, since the base part of the package body is configured by contacting the plurality of thin sheets mutually closely with each other and by bonding integrally with each other, and the high heat transfer element is provided in the base part, uniformity in the adhesion of the high heat transfer element to the base part is improved and therefore the thermal conductivity between the base part and the high heat transfer element is increased. In addition, the base part of the package body can be made thinner and is easy to manufacture.

BRIEF DESCRIPTION OF THE SEVERAL VIEWS OF THE DRAWING

The accompanying drawings, which are incorporated in and constitute a part of the specification, illustrate an embodiment of the invention, and together with the general description given above and the detailed description of the embodiment given below, serve to explain the principles of the invention.

DETAILED DESCRIPTION OF THE INVENTION

Figure 1:
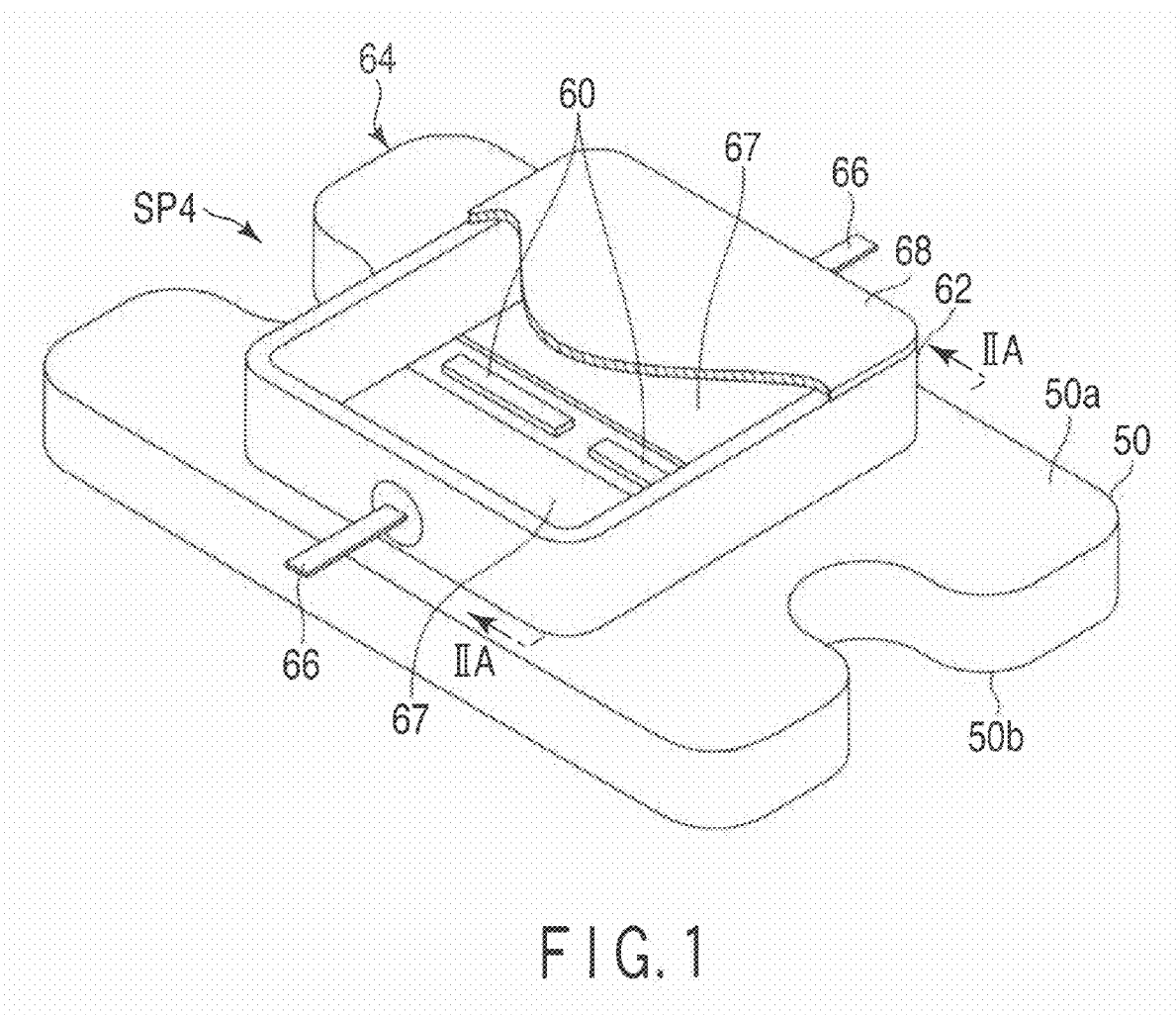
FIG. 1 is a schematic perspective view showing a semiconductor package according to an embodiment of the present invention with a portion of a cover of a semiconductor housing part of a package body being cut out.

Next, a semiconductor package SP4 according to an embodiment of the present invention will be described with reference to FIGS. 1, 2A, and 2B.

The semiconductor package SP4 according to the embodiment comprises a package body 64 including a base part 50 which has a first surface 50a and a second surface 50b on the opposite side of the first surface 50a and which is configured by contacting a plurality of thin sheets 52, 54, 56, and 58 with each other and by bonding integrally with each other (for example, a diffusion bonding), and a semiconductor device housing part 62 which is provided on the first surface 50a and in which semiconductor devices 60 are housed.

The semiconductor device housing part 62 is provided with electric terminals 66 which are electrically connected to the semiconductor devices 60 housed in the semiconductor device housing part 62 and which are exposed on the outer surface of the semiconductor device housing part 62.

In the present embodiment, the semiconductor device housing part 62 houses also peripheral circuit mounting substrates 67 on which peripheral circuits for the semiconductor devices 60 are mounted, and the semiconductor devices 60 are connected to the electric terminals 66 via wires on the peripheral circuit mounting substrates 67.

The base part 50 in the present embodiment includes a plurality of thin sheets 52 formed of metallic material having high thermal conductivity (for example, copper, aluminum, copper alloy, aluminum alloy or metallic material having similar thermal conductivity to those of the above described examples; the thermal conductivity of copper is approximately 400 W/mK), at least one thin sheet 54 having a thermal expansion coefficient equal to or less than that of the substrate of each semiconductor device 60 or that of each peripheral circuit mounting substrate 67, a first thin sheet 56 including the first surface 50a and a second thin sheet 58 including the second surface 50b.

The semiconductor device housing part 62 has a cylindrical shape providing an inner space to house the semiconductor devices 60 and the peripheral circuit mounting substrates 67 relating to the semiconductor devices 60 and surrounds a predetermined area on the first surface 50a of the base part 50. The semiconductor devices 60 and the peripheral circuit mounting substrates 67 are placed on the predetermined area on the first surface 50a. The semiconductor device housing part 62 includes a cover 68 covering an opening on the opposite side of the predetermined area on the first surface 50a of the base part 50. The cover 68 closes the opening to seal the inner space from an outer space after the semiconductor devices 60 and the peripheral circuit mounting substrates 67 are placed on the predetermined area on the first surface 50a and then the semiconductor devices 60, the peripheral circuit mounting substrates 67 and the electric terminals 66 are mutually connected.

A high heat transfer element 70 having higher thermal conductivity than that of the base part 50 is provided in the base part 50 from a heat generating part corresponding position corresponding to a heat generating part of the semiconductor device 60 housed in the semiconductor device housing part 62, in the base part 50 (an area adjacent to the heat generating part of the semiconductor device 60 on the first surface 50a of the base part 50) to a position outside the heat generating part corresponding position in the base part 50, i.e., in the present embodiment, outside the semiconductor device housing part 62. The high heat transfer element 70 transfers heat generated by the heat generating part of the semiconductor device 60 from the heat generating part corresponding position to the outside position in the base part 50.

In the present embodiment, the high heat transfer element 70 includes, for example, particles of carbon nanotube or diamond. The particles of carbon nanotube or diamond are dispersed between two mutually adjacent sheets among the plurality of thin sheets 52, 54, 56, and 58 of the base part 50. The dispersion can be of various patterns. That is, heat can effectively be transferred from the heat generating part corresponding position to a desired position outside the heat generating part corresponding position in the base part 50. Further, the amount of the particles of expensive carbon nanotube or diamond to be used can be reduced to a minimum.

Figure 2A:
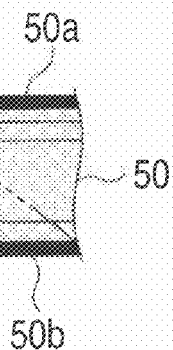
FIG. 2A is a schematic longitudinal sectional view along a line IIA-IIA in FIG. 1.
Figure 2B:
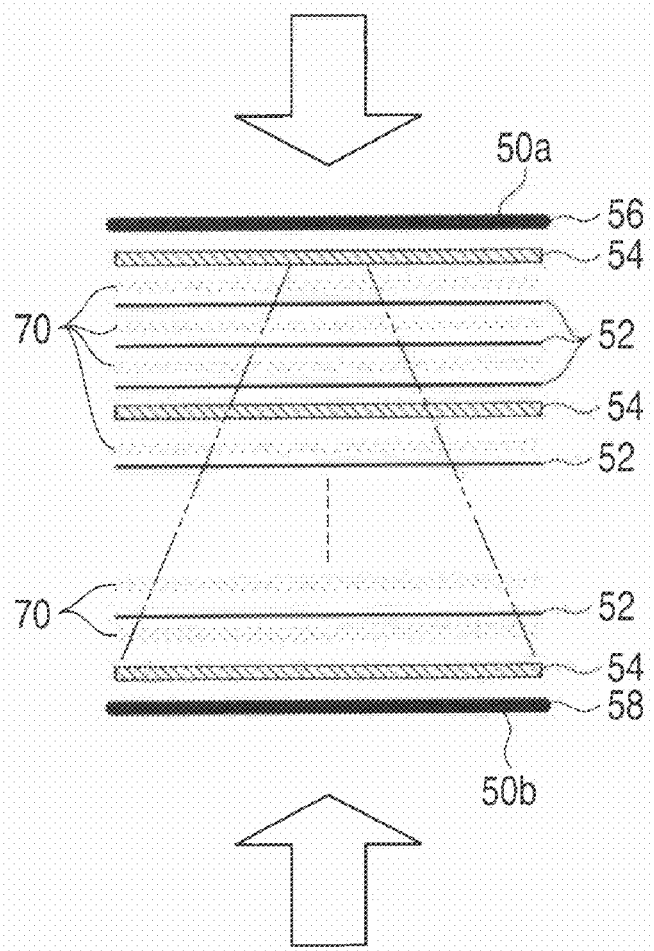
FIG. 2B is an exploded view in which a plurality of components in the longitudinal section schematically shown in FIG. 2A are separated from each other.

For example, as illustrated by two-dots chain line in FIGS. 2A and 2B, the particles can be distributed so as to be spread from the heat generating part corresponding position on the first surface 50a to the outside area on the second surface 50b along the first and second surfaces 50a and 50b of the base part 50 while moving in the thickness direction of the base part 50 from the first surface 50a toward the second surface 50b.

If the amount of heat generated by the semiconductor device 60 increases, the substrate (normally made of silicon) of the semiconductor device 60 and/or the peripheral circuit mounting substrate 67 are more likely to be cracked or fractured due to a difference in the thermal expansion coefficient between the substrate of the semiconductor device 60 or the peripheral circuit mounting substrate 67 and that of the base part 50. In order to prevent the substrate of the semiconductor device 60 and/or the peripheral circuit mounting substrate 67 from cracking or fracturing, at least one thin sheet 54 having a thermal expansion coefficient equal to or less than that of the substrate of the semiconductor device 60 or that of the peripheral circuit mounting substrate 67 is included in the plurality of thin sheets configuring the base part 50. As a material for the thin sheet 54, for example, molybdenum is known. The thickness and shape of the thin sheet 54 and the arrangement thereof in the base part 50 are set so that the cracking or fracturing of the substrate of the semiconductor device 60 and/or that of the peripheral circuit mounting substrate 67 due to the difference in the thermal expansion coefficient can be prevented, and also a desired heat transfer function in the base part 50 is not lost.

The first thin sheet 56 including the first surface 50a and the second thin sheet 58 including the second surface 50b among the plurality of thin sheets 52, 54, 56, and 58 of the base part 50 do not allow the particles of the high heat transfer element 70 to be exposed from the first surface 50a and the second surface 50b.

In the present embodiment, the plural sheets 52, 54, 56, and 58 of the base part 50 are mutually closely in contact with each other and bonded integrally with each other (subjected to diffusion bonding) in a state in which the high heat transfer element 70 is arranged in a desired pattern therebetween, by applying high pressure, as shown by arrows in FIG. 2B, to the first surface 50a and the second surface 50b in the thickness direction of the base part 50 at high temperature after the particles of the high heat transfer element 70 are dispersed in the desired pattern between two mutually adjacent sheets among the plurality of thin sheets 52, 54, 56, and 58 of the base part 50. During this bonding, the particles of the high heat transfer element 70 are bit into the adjacent two thin sheets. The first thin sheet 56 including the first surface 50a and the second thin sheet 58 including the second surface 50b are not in contact with the particles of the high heat transfer element 70, and the first surface 50a and the second surface 50b are exposed to the outer space.

Therefore, by setting the thickness of each of the first thin sheet 56 and the second thin sheet 58 larger than the diameter of each particle of the high heat transfer element 70, the first thin sheet 56 and the second thin sheet 58 in the base part 50 do not allow the particles of the high heat transfer element 70 to be exposed from the first surface 50a and the second surface 50b.

Additional advantages and modifications will readily occur to those skilled in the art. Therefore, the invention in its broader aspects is not limited to the specific details and representative embodiment shown and described herein. Accordingly, various modifications may be made without departing from the spirit or scope of the general inventive concept as defined by the appended claims and their equivalents.

What is claimed is:

1. A semiconductor package comprising:
   a package body including a base part having a first surface and a second surface on an opposite side of the first surface, and a semiconductor device housing part provided on the first surface and in which a semiconductor device having a heat generating part is housed, the base part further having a heat generating part corresponding position corresponding to the heat generating part of the semiconductor device and a position outside the heat generating part corresponding position;
   an electric terminal provided in the semiconductor device housing part, electrically connected to the semiconductor device, and exposed to an outer surface of the semiconductor device housing part; and
   a high heat transfer element having a thermal conductivity higher than that of the base part, arranged from the heat generating part corresponding position to the outside position in the base part, and transferring heat generated by the heat generating part of the semiconductor device from the heat generating part corresponding position to the outside position in the base part,
   the base part being configured by contacting a plurality of thin sheets mutually closely with each other and by bonding integrally with each other,
   the high heat transfer element including particles configured by a material having a thermal conductivity higher than that of the base part, and dispersed in the base part, and
   the particles of the high heat transfer element being dispersed between two mutually adjacent thin sheets among the plurality of thin sheets of the base part.

2. The semiconductor package according to claim 1, wherein a first thin sheet including the first surface and a second thin sheet including the second surface among the plurality of thin sheets of the base part prevent the particles of the high heat transfer element from exposing on the first surface and the second surface.

3. The semiconductor package according to claim 1, wherein the plurality of thin sheets of the base part includes at least one thin sheet having a thermal expansion coefficient equal to or less than that of a substrate of the semiconductor device.

4. The semiconductor package according to claim 1, wherein a peripheral circuit mounting substrate mounting a peripheral circuit for the semiconductor device is further housed in the semiconductor device housing part, and
   the plurality of thin sheets of the base part includes at least one thin sheet having a thermal expansion coefficient equal to or less than that of a substrate of the semiconductor device or the peripheral circuit mounting substrate.

5. The semiconductor package according to claim 1, wherein the particles of the high heat transfer element includes particles of diamond.

* * * * *